United States Patent
Sun et al.

(10) Patent No.: US 11,454,733 B2
(45) Date of Patent: Sep. 27, 2022

(54) SYSTEM AND METHOD FOR ANALYSIS OF SUBSURFACE DATA

(71) Applicant: CHEVRON U.S.A. INC., San Ramon, CA (US)

(72) Inventors: Tao Sun, Missouri City, TX (US);
Brian J. Willis, Houston, TX (US);
Maisha L. Amaru, Houston, TX (US);
Ashley D. Harris, Houston, TX (US);
Morgan David Sullivan, Spring, TX (US)

(73) Assignee: Chevron U.S.A. Inc., San Ramon, CA (US)

( * ) Notice: Subject to any disclaimer, the term of this patent is extended or adjusted under 35 U.S.C. 154(b) by 116 days.

(21) Appl. No.: 16/694,870

(22) Filed: Nov. 25, 2019

(65) Prior Publication Data

US 2020/0174145 A1 Jun. 4, 2020

Related U.S. Application Data

(60) Provisional application No. 62/773,672, filed on Nov. 30, 2018.

(51) Int. Cl.
*G01V 1/30* (2006.01)
*G01V 1/00* (2006.01)
*G01V 1/34* (2006.01)

(52) U.S. Cl.
CPC .............. *G01V 1/30* (2013.01); *G01V 1/003* (2013.01); *G01V 1/34* (2013.01)

(58) Field of Classification Search
CPC . G01V 1/30; G01V 1/003; G01V 1/34; G01V 2210/661; G01V 2210/667; G01V 99/005; G06F 30/20
See application file for complete search history.

(56) References Cited

U.S. PATENT DOCUMENTS

| | | | | |
|---|---|---|---|---|
| 9,523,783 | B2 * | 12/2016 | Leahy | G01V 1/345 |
| 9,619,590 | B2 * | 4/2017 | Tompkins | G06F 30/20 |
| 10,087,723 | B2 | 10/2018 | Harris et al. | |
| 10,108,760 | B2 | 10/2018 | Sun et al. | |
| 10,287,858 | B2 | 5/2019 | Ghayour et al. | |
| 10,317,569 | B2 | 6/2019 | Sun et al. | |
| 10,767,448 | B2 * | 9/2020 | Djikpesse | E21B 43/00 |
| 10,901,105 | B2 * | 1/2021 | Halsey | G01V 1/306 |
| 2002/0133323 | A1 | 9/2002 | Dahlberg | |
| 2010/0299126 | A1 * | 11/2010 | Chugunov | G01V 11/00 703/10 |

(Continued)

FOREIGN PATENT DOCUMENTS

EP 3121622 A1 1/2017

OTHER PUBLICATIONS

PCT International Search Report and Written Opinion, dated Feb. 19, 2020, issued in International Application No. PCT/IB2019/060111, filed on Nov. 25, 2019, 14 pages.

*Primary Examiner* — Mohammad K Islam
(74) *Attorney, Agent, or Firm* — Marie L. Clapp

(57) ABSTRACT

A method is described for analysis of subsurface data including the use of physics-based modeling and experimental design that allows calculation of probabilities of physical subsurface properties. The method may include calculations of key controlling parameters. The method may include using multiple dimension scaling. The method may be executed by a computer system.

7 Claims, 9 Drawing Sheets

(56) References Cited

U.S. PATENT DOCUMENTS

| | | | | |
|---|---|---|---|---|
| 2011/0054869 A1* | 3/2011 | Li | ............................ | G06F 30/20 |
| | | | | 703/10 |
| 2011/0060572 A1* | 3/2011 | Brown | .................... | E21B 43/00 |
| | | | | 703/10 |
| 2011/0307230 A1* | 12/2011 | Lee | ........................ | G01V 99/00 |
| | | | | 703/10 |
| 2011/0307438 A1* | 12/2011 | Fernández Martínez | ..................... | |
| | | | | G06N 7/005 |
| | | | | 706/52 |
| 2013/0185033 A1* | 7/2013 | Tompkins | ................ | G06F 17/11 |
| | | | | 703/2 |
| 2016/0326845 A1* | 11/2016 | Djikpesse | ............... | G06Q 50/02 |
| 2017/0017883 A1* | 1/2017 | Zhou | ........................ | G06N 20/20 |
| 2017/0315266 A1* | 11/2017 | Myers | ................... | G01V 99/005 |
| 2018/0357343 A1* | 12/2018 | Klenner | ................... | G06N 3/08 |

* cited by examiner

SYSTEM AND METHOD FOR ANALYSIS OF SUBSURFACE DATA

CROSS-REFERENCE TO RELATED APPLICATIONS

This application claims priority from U.S. Provisional Patent Application 62/773,672 filed Nov. 30, 2018.

STATEMENT REGARDING FEDERALLY SPONSORED RESEARCH OR DEVELOPMENT

Not applicable.

TECHNICAL FIELD

The disclosed embodiments relate generally to techniques for analyzing subsurface data such as well logs and seismic data and, in particular, to a method of physics-based uncertainty analysis of subsurface data.

BACKGROUND

Uncertainty analysis is a key step for decision making in every stage of business in oil and gas industry. Our abilities to accurately characterize and quantify the uncertainties in our exploration, development, and production of subsurface assets will often have profound and long-lasting impact on the bottom lines of the economics of our business.

Most of the existing methods for uncertainty analysis are all based on statistical methods and often include the following common steps:

1. Define a set of "uncertainty parameters"
2. Define (assume) distributions of each "uncertainty parameters"
3. Building scenarios by using some statistic method, mostly simple Monte Carlo method, to draw values of each parameters from their corresponding distributions
4. Compute the statistically expected value (P90, P50 and P10) for some properties interest, such as Net-to-Gross, EUR and any reservoir quality measures, from above samples.

While many of the above described methods have been widely applied in the industry, an important issue that is common to all the methods described above has also emerged and has been widely recognized by generally practitioners and decision makers in the last decade. The issue is that in the practice, the decision makers are more than often "surprised" by the scenarios fall out of P10 and P90 ranges that are given by the existing methods.

To avoid being surprised by "unexpected" scenarios, the common practice is to widen the distribution function for the relevant uncertainty parameters. However, this method of simply widen the distribution functions has been shown to be not effective as illustrated in FIG. 1.

In FIG. 1, scenarios of a subsurface asset are represented by the dots shown in the two-dimensional parameter space defined by the uncertainty parameter P1 and P2. All white dots represent the scenarios that are physically and geologically plausible. Among all the white dots, those white dots without black outlines represent the scenarios were captured by the uncertainty analysis where the uncertainty range for parameter P1 is $\sigma_1$, and the uncertainty range for the parameter 2 is $\sigma_2$. The white dots with black outlines represent those important scenarios that fall out of the range defined by range $\sigma_1$ and $\sigma_2$ corresponding to P1 and P2 respectively. Gray dots represent scenarios that are physically implausible.

The simple situation illustrated in FIG. 1 shows that some important scenarios are not captured in the uncertainty analysis when the ranges of uncertainty parameters P1 and P2 are chosen to be $\sigma_1$ and $\sigma_2$. The only way for the existing methods to account for these uncaptured scenarios is to widen the ranges of P1 and P2, from $\sigma_1$ and $\sigma_2$, to $\sigma_1+\Delta\sigma_1$ and $\sigma_2+\Delta\sigma_2$, respectively. However, as it is shown in the figure, by doing so, a disproportional amount of physically implausible scenarios (represented by the gray dots in the figure) will also likely be included the analysis and will significantly diminish the impact of the previously unaccounted, but physically plausible scenarios (represented by white dots with black outlines) on the final P10, P50 and P90 values. In fact, as the number of uncertainty parameters increases, the faster the effect from these additional physically plausible scenarios diminishes in the uncertainty analysis, because the number of physically implausible cases scales to the power of the number of dimensions. Consequently, this will lead to the false P10, P50 and P90 values that have little to do with reality.

Other shortcomings of the existing simple statistical and Monte Carlo based methods are:

1. The simple statistical and "Monte Carlo" based method hinges on following assumptions which are often NOT true:
   All the parameters used in the uncertainty analysis are completely independent variables.
   All the scenarios described by any combinations of the values of the parameters are all physically plausible.
2. Uncertainty parameters used in "Monte Carlo" based methods are often the "descriptive" parameters of the system (parameters describe the properties of the system), rather than the "controlling" parameters of the system (parameters controls the existence of the system).
3. No effective means to accurately account for the scenarios that are physically plausible
4. No effective means to apply data in a quantitative manner to better constrain and update uncertainty analysis
5. No effective means to quantitatively define the source of uncertainties.

Therefore, the existing methods for uncertainty analysis often become "games of statistics" without any connections to real physical world.

There exists a need for improved uncertainty analysis of subsurface data in order to produce potential hydrocarbon reservoirs.

SUMMARY

In accordance with some embodiments, a method of subsurface data analysis including receiving subsurface data representative of a subsurface volume of interest; identifying key controlling parameters for the subsurface volume of interest; determining maximum possible ranges for each of the key controlling parameters; applying experimental design methods to generate an initial set of model input parameters corresponding to an initial set of scenarios wherein the initial set of scenarios lie within the maximum possible ranges; creating models for a subsurface asset corresponding to each of the input parameter combinations as given by the experimental design using physics-based modeling; comparing each of the models with the subsurface data representative of a subsurface volume of interest and adding models that are consistent with the subsurface data to an ensemble of digital analogs for the subsurface volume of interest; developing statistical predictions, for example, P10, P50 and P90 values, for any specific property and quality for the subsurface volume of interest using the ensemble of the digital analogs; and displaying, on a graphical interface, at least one of the ensemble of digital analogs and the statistical predictions is disclosed.

In another aspect of the present invention, to address the aforementioned problems, some embodiments provide a non-transitory computer readable storage medium storing one or more programs. The one or more programs comprise instructions, which when executed by a computer system with one or more processors and memory, cause the computer system to perform any of the methods provided herein.

In yet another aspect of the present invention, to address the aforementioned problems, some embodiments provide a computer system. The computer system includes one or more processors, memory, and one or more programs. The one or more programs are stored in memory and configured to be executed by the one or more processors. The one or more programs include an operating system and instructions that when executed by the one or more processors cause the computer system to perform any of the methods provided herein.

BRIEF DESCRIPTION OF THE DRAWINGS

Like reference numerals refer to corresponding parts throughout the drawings.

DETAILED DESCRIPTION OF EMBODIMENTS

Described below are methods, systems, and computer readable storage media that provide a manner of uncertainty analysis of subsurface data. These embodiments are designed to be of particular use for generating graphic displays of uncertainty analysis of subsurface data.

Reference will now be made in detail to various embodiments, examples of which are illustrated in the accompanying drawings. In the following detailed description, numerous specific details are set forth in order to provide a thorough understanding of the present disclosure and the embodiments described herein. However, embodiments described herein may be practiced without these specific details. In other instances, well-known methods, procedures, components, and mechanical apparatus have not been described in detail so as not to unnecessarily obscure aspects of the embodiments.

Herein is disclosed a new method for conducting uncertainty analysis that is fully physics-based. The method allows the sampling over the broadest possible ranges of scenarios, including only the scenarios that are physically plausible. The method can capture the unexpected scenarios and can properly account for the rare but extreme significant scenarios which could have significant impact on the subsurface assets' economics.

Figure 1:
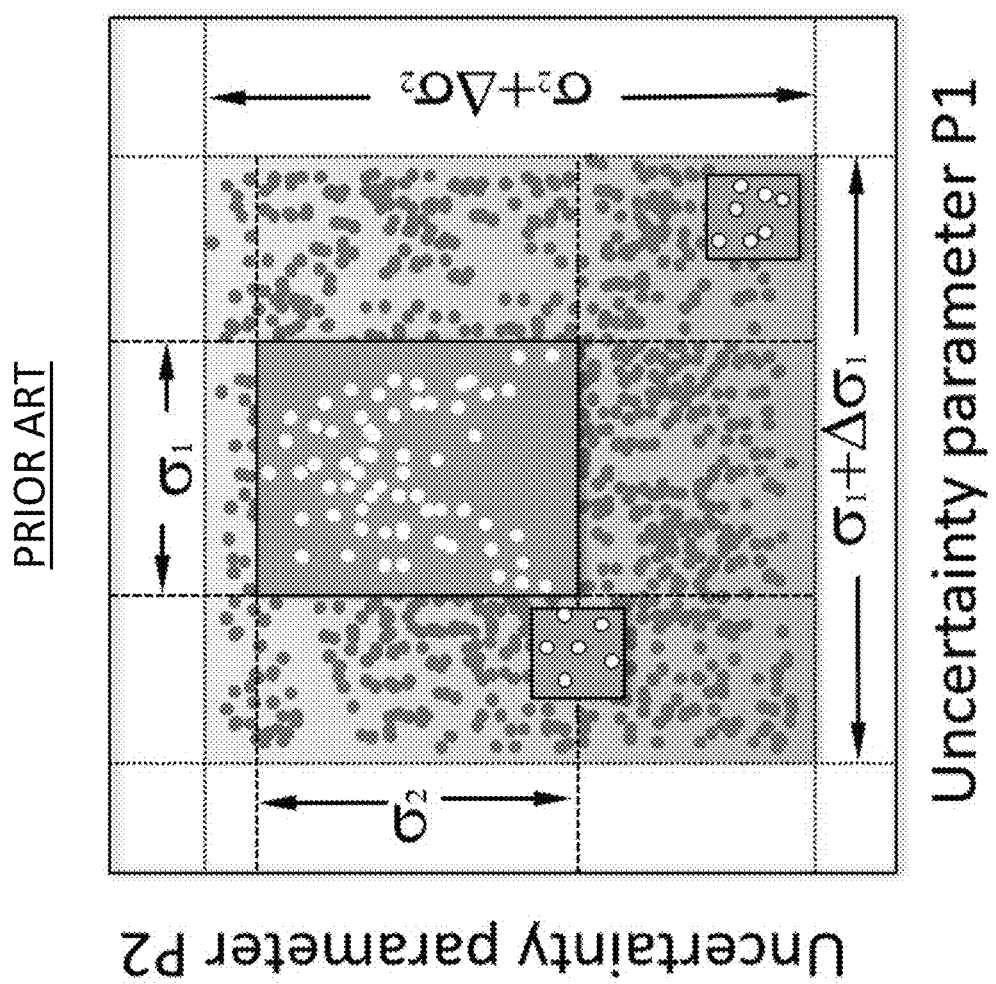
FIG. 1 illustrates a prior art method of uncertainty analysis.
Figure 2:
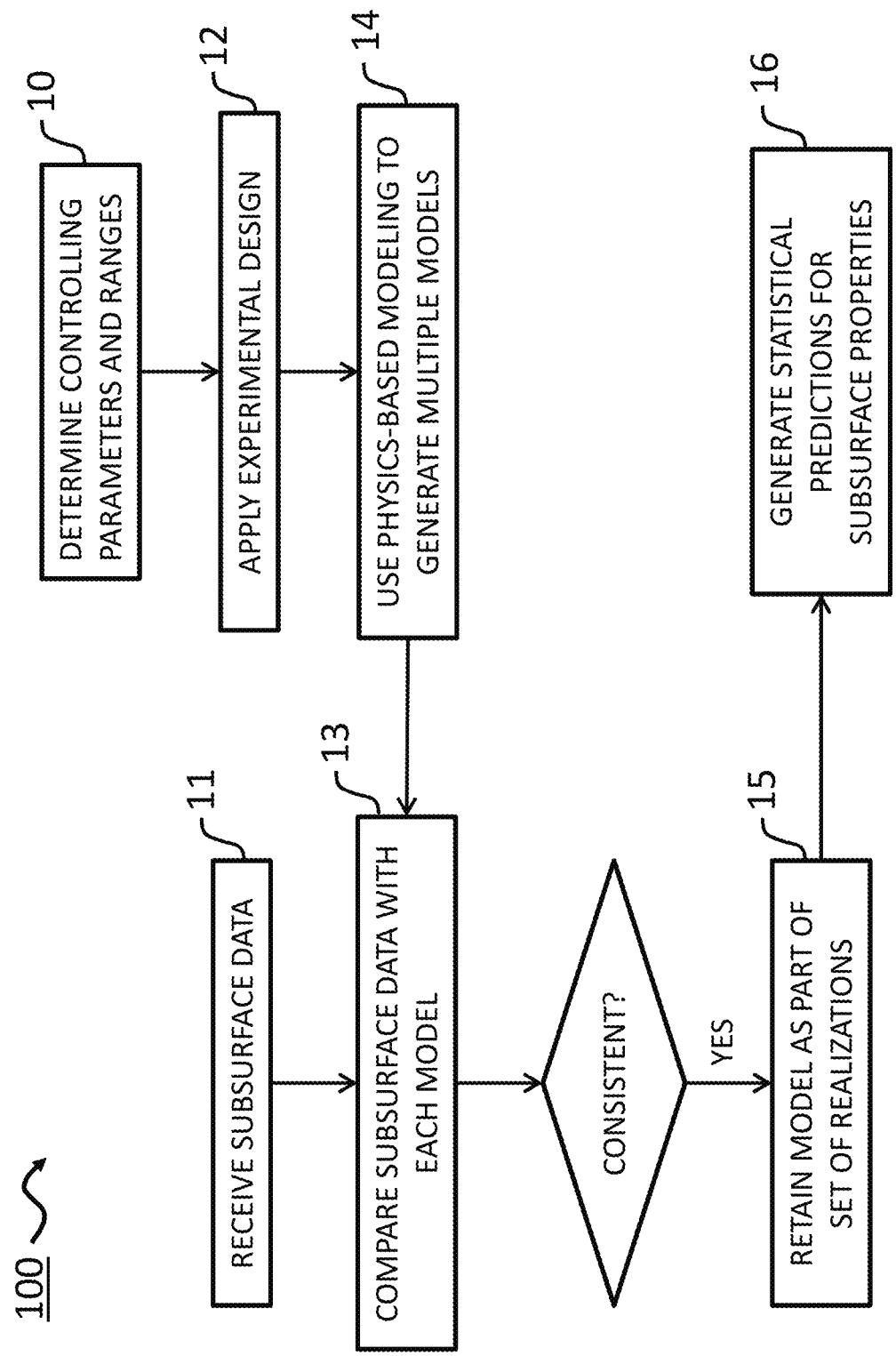
FIG. 2 illustrates a flowchart of a method of physics-based uncertainty analysis, in accordance with some embodiments.

FIG. 2 illustrates a flowchart of a method 100 for physics-based uncertainty analysis. At operation 11, the method gathers all the data that is available for the subsurface system of interest. These data could include, but are not limited to well logs, cores and seismic data sets.

Figure 3:
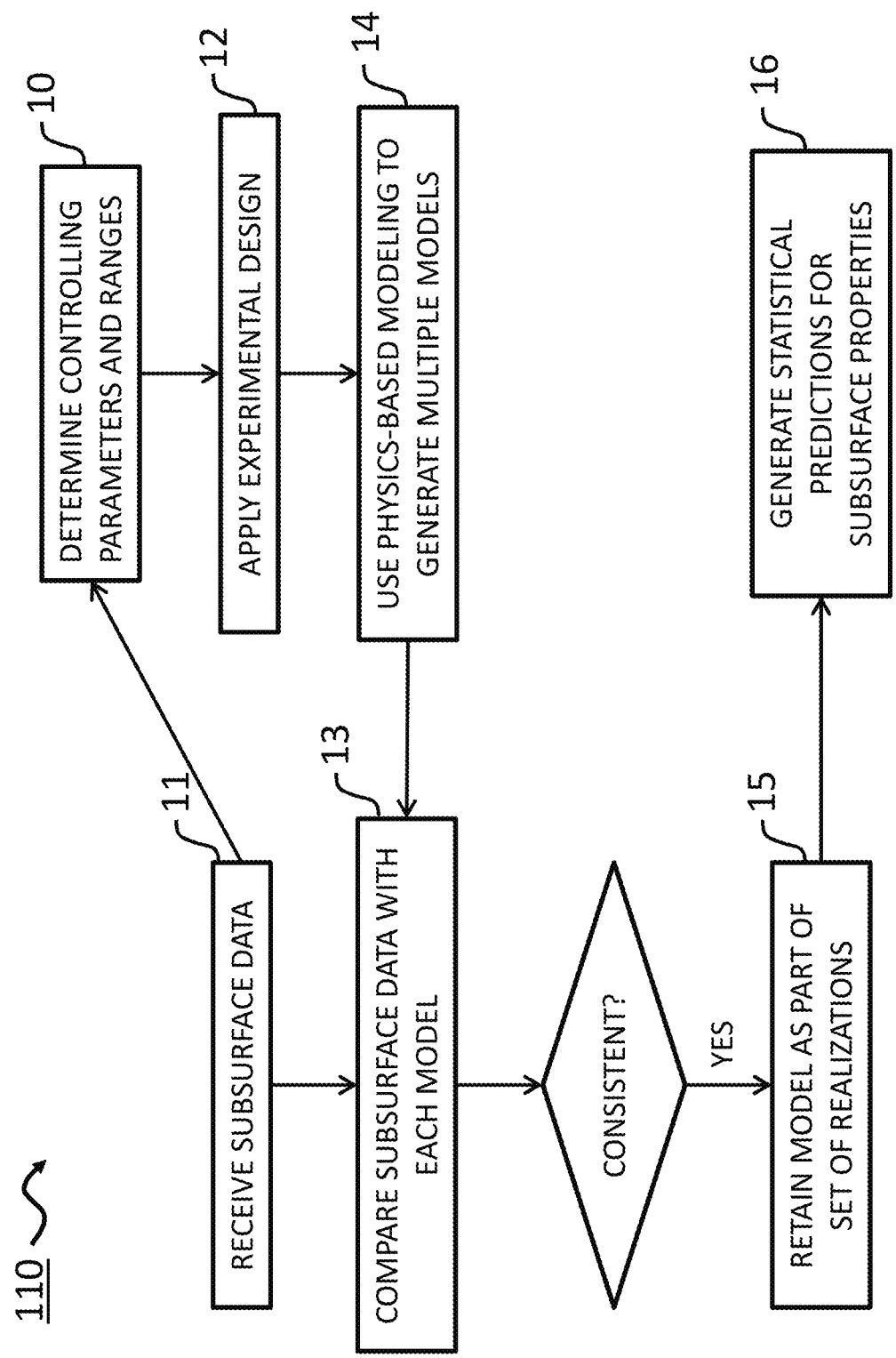
FIG. 3 illustrates a flowchart of a method of physics-based uncertainty analysis, in accordance with other embodiments.

In parallel to operation 11, the method at operation 10 identifies key controlling parameters and ranges for the subsurface system of interest (e.g., the geologic basin) using existing and standard geologic and stratigraphic analysis workflows that are well known to the geoscientists in the field. Examples of the key controlling parameters could include basin topography, subsidence rate, sea level and sea level changes, source location for the sediment supply, grain sizes and rock types distribution of the sediment supply, the magnitude of the flow into the basin, etc. These key controlling parameters will be specific to the geologic basin being investigated. Using standard geologic analysis, the maximum possible ranges for each of the controlling parameters identified are determined. Since all of the controlling parameters identified in operation 10 are physical and geological, the choice of the maximum possible ranges for each of the controlling parameters will all based on physics laws and known geologic record. Any available geologic data bases, records, and/or scaling relationships could be used to define the range of the relevant controlling parameters. Examples include well-established sea level curves, channel geometry scaling relationships, hydrographs and data base on river flow and sediment information. This is illustrated in FIG. 3 which is a variation of method 100. In FIG. 3, method 110 has a link between operation 11 receiving subsurface data and operation 10 determining controlling parameters and ranges.

Once the controlling parameters and ranges are determined, the method 100 applies standard experimental design methods that are well known to people who are familiar with the art at operation 12, which will generate an initial set of model input parameters corresponding to an initial set of scenarios. In one embodiment, sensitivity of the model results with regarding to the model parameters may first be obtained by performing physics-based modeling corresponding to the initial set of the model input parameters and examining the physics-based modeling results with regard to the target property of the uncertainty analysis as a function of the model parameters. A linear or nonlinear fit may be made and the sensitivity of the uncertainty property with regard to the model parameter may be estimated. The model parameters may be rescaled accordingly, and the experimental design can be re-done in the rescaled parameter space to increase the sample efficiency. In another embodiment, advanced experimental methods such as Latin Hypercube Sampling (LHS) may be applied to generate a near-random sample of parameter values from a multidimensional distribution. In a third embodiment, both re-scaling and Latin Hypercube Sampling can be applied.

Operation 14 performs any physics-based modeling, e.g. computational stratigraphy (for example, any of the methods of U.S. Pat. Nos. 10,287,858; 10,087,723; 10,108,760; and 10,317,569) to create models for the subsurface asset corresponding to each of the input parameter combinations as given by the experimental design. The number of models that are needed varies as the number of controlling uncertainty parameters varies. By way of example and not limitation, a value range from 2 to 10 times the number of controlling uncertainty parameters can be used as the number of models be created as the initial set of the models for the analysis.

Each of the models generated by the physics-based modeling of operation 14 is compared against the available data gathered from the field from operation 11 in either method 100 or 110. If the results of the comparison show that the model is consistent with the data from the field, then the model can be regarded as representative of the field, and the model will be retained as one of many realizations of the subsurface assets of the interest at operation 15. If the results of the comparison show that the model is not consistent with the data from the field, then that model will be thrown out and not be used in the subsequent analysis. Every model that has been retained is a digital analog of the subsurface asset. The collection of the digital analogs is termed as ensemble of digital analogs for that specific subsurface asset.

Figure 4:
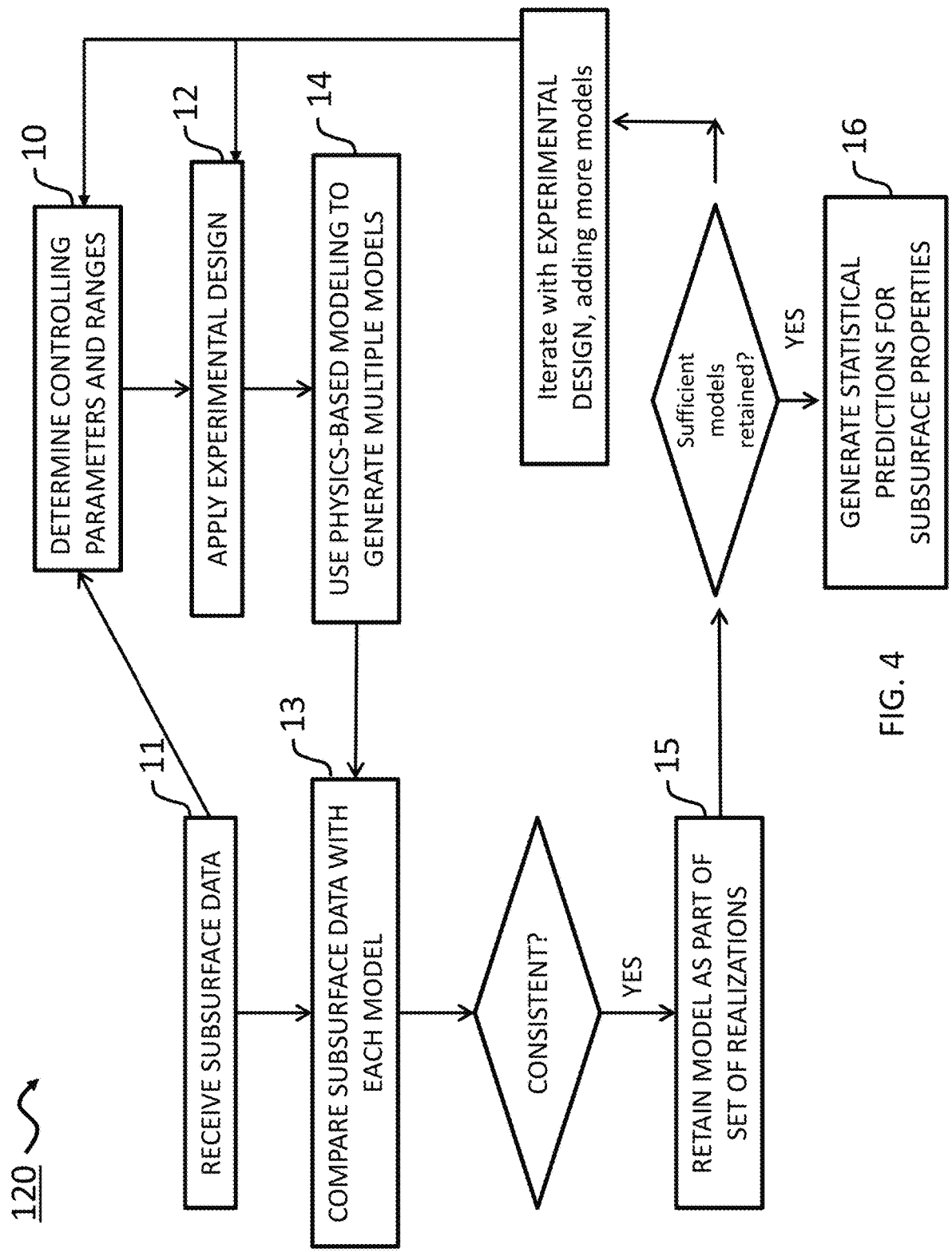
FIG. 4 illustrates a flowchart of a method of physics-based uncertainty analysis, in accordance with other embodiments.

As shown in FIG. 4, an embodiment may check on whether a sufficient number of models were retained by operation 15. A sufficient number of models may be decided by the computer or as a user-specified input. While the standard of what number of the retained experiments is sufficient varies with the questions that are asked, the empirical guidance will be about minimum of ⅓ of the models are valid. The method disclosed here shall however, not be limited to the value of ⅓. Other indications of insufficiency are if all the retained models correspond to extreme end of the range of values of the model parameters. That will be an indication that the selected range of those model parameters in the previous experimental design are too narrow and need to be made more broad. If the number of retained models is not sufficient, the method may iterate using more experimental design with large number of total experiments being targeted at the design stage. For example, in Latin Hyper Cube sampling methods, one can specify the total number of experiments to be created by the design. In practice, this iteration step often involves increasing the number of sampling intervals corresponding to each model parameters, and/or increasing the range of each parameter. As shown in FIG. 4, the iteration with experimental design will lead back to operations 10 and 12 as needed until a sufficient number of model are retained in order to generate statistical predictions for the subsurface properties at operation 16.

Once the ensemble of digital analogs has been generated, operation 16 develops statistical predictions, for example, P10, P50 and P90 values, for any specific property and quality for the asset using the ensemble of the digital analogs. For example, if the question is about the uncertain of total Net-to-Gross (N/G) of a particular reservoir, then the values of N/G of regions in each digital analog and/or of whole digital analog that are representing the real field are first calculated. The statistical distributions of N/G can then be constructed using the standard statistical methods and the statistical predictions of the N/G can be made. In an embodiment, additional constraining data can also be applied in the calculations of the statistical values such as P10, P50 and P90 predictions of any properties of the subsurface asset. For example, if P50 of the Net-to-Gross (N/G) value for a subsurface assets has already been determined from other sources of data, or from alternative business or practical considerations, or simply need to be assumed, then rather than computing P10, P50, and P90 directly from the ensemble of the digital analogs, the statistics of the variabilities of the N/G values may be computed and the range between P90 and P10 value may be determined from the ensemble of the digital analogs. Combining with the P50 value that is given, P10 and P90 can then be obtained. For example, if P50 values for a particular property of the subsurface asset, such as N/G, were obtained from certain number of wells, then the statistics of the N/G value obtained from the same number of wells from the digital analogs in the ensemble can be obtained. The range of the P90 to P10 value can be extracted from the statistics. Then the P90 and P10 N/G value can be obtained for that subsurface asset using the given P50 value as the P50 value.

Figure 5:
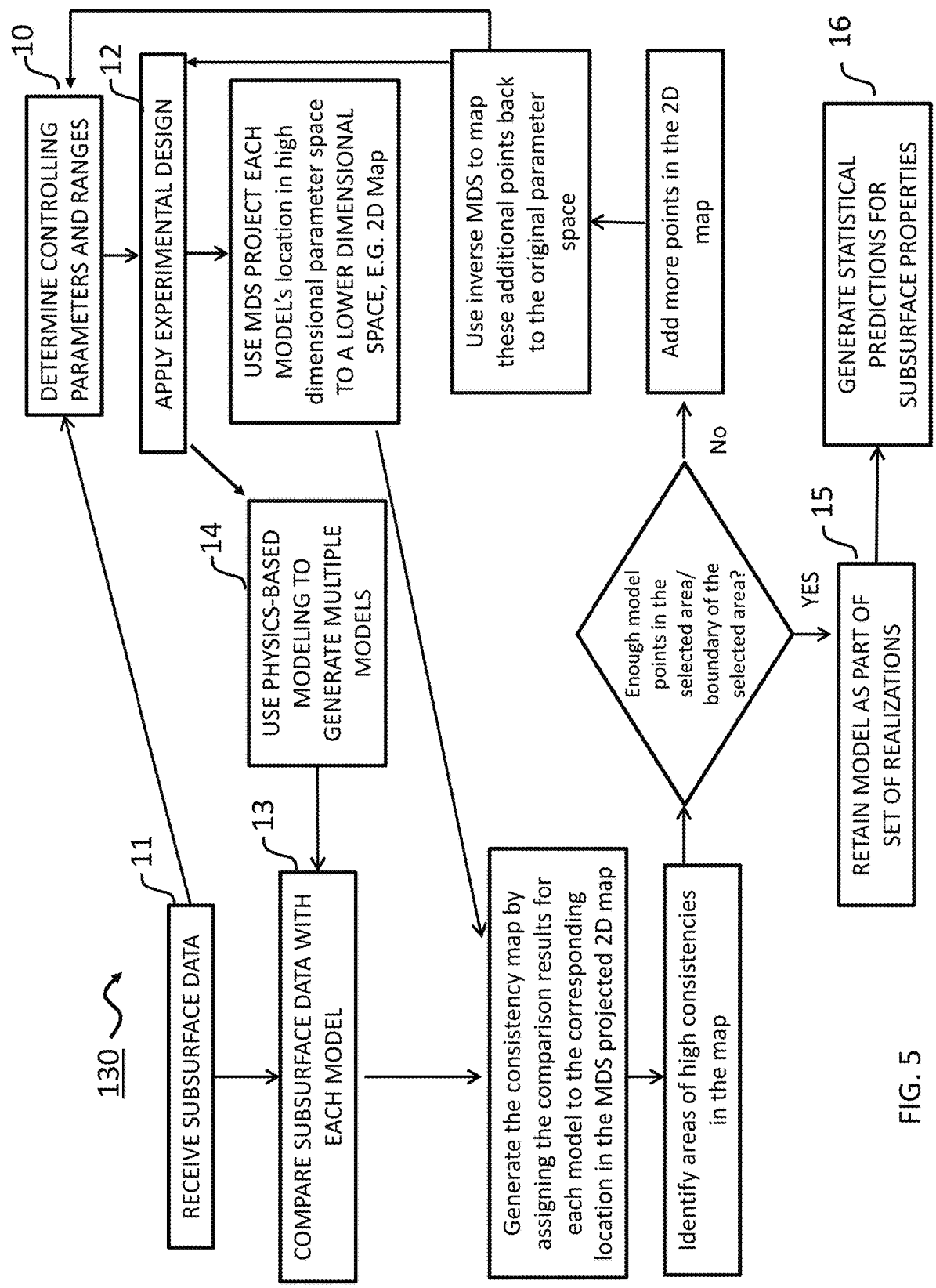
FIG. 5 illustrates a flowchart of a method of physics-based uncertainty analysis, in accordance with other embodiments.
Figure 6:
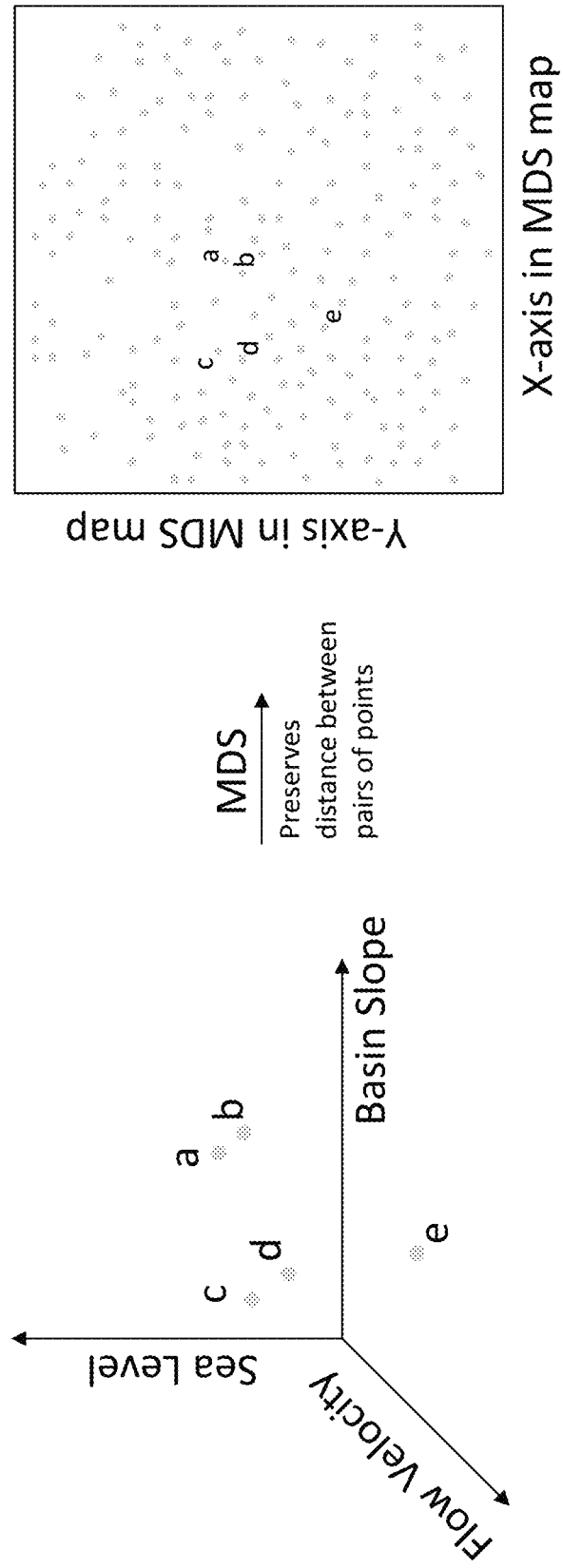
FIG. 6 illustrates a step of a method of physics-based uncertainty analysis, in accordance with some embodiments.

FIG. 5 illustrates another embodiment of the current invention, method 130, that adds operations related to mapping the models to two-dimensional space in order to aid analysis in selected areas. Methods include but are not limited to MDS (multiple dimension scaling) may be used to map all the models, e.g. computational stratigraphy models from the original hyper-dimensional parameter space to a two-dimensional space, as is demonstrated in FIG. 6. MDS maps points in hyper dimensional space to two-dimensional space by preserving the distance of each pairs of points before and after the mapping. At the same time, physics-based modeling, such as computational stratigraphy modeling, can be performed on each of the model from the experimental design. After the physics-based models are created by performing the physics based modeling, or computational stratigraphy modeling, any measure of the model, e.g. Net-To-Gross (N/G), Estimated Ultimate Recovery (EUR), quality of matching wells from the field, can then be represented as a value at the point representing that particular model on the mapped 2-dimensional space. Extrapolations may be performed to fill the areas between the points on the map. Different measure will result in a different map. For example, the measure of the N/G at the targeted locations will lead to a map of N/G at the targeted location. The measure of model well amalgamation rate at the targeted locations will lead to an amalgamation map for wells at the targeted locations.

Figure 7:
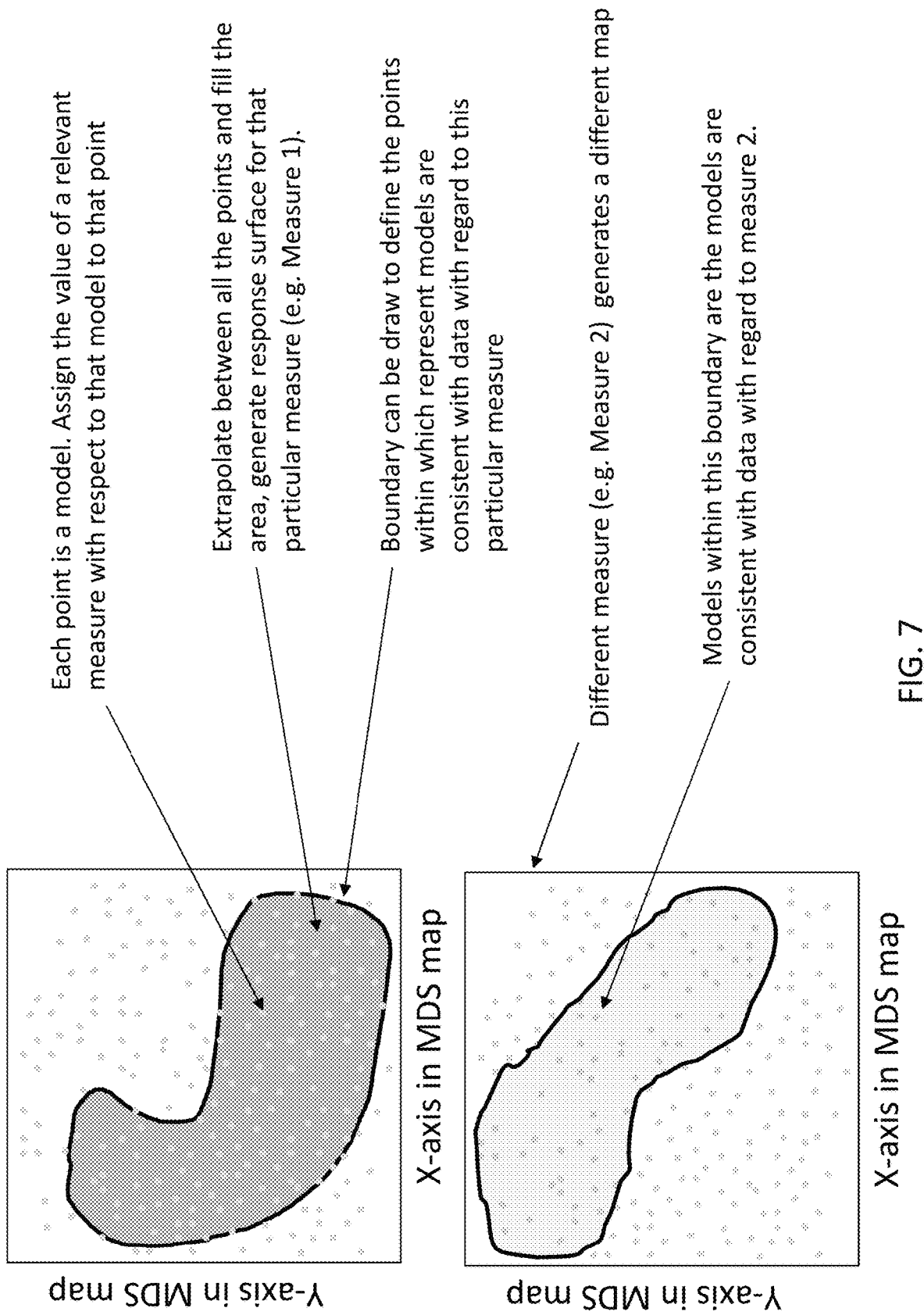
FIG. 7 illustrates a step of a method of physics-based uncertainty analysis, in accordance with some embodiments.
Figure 8:
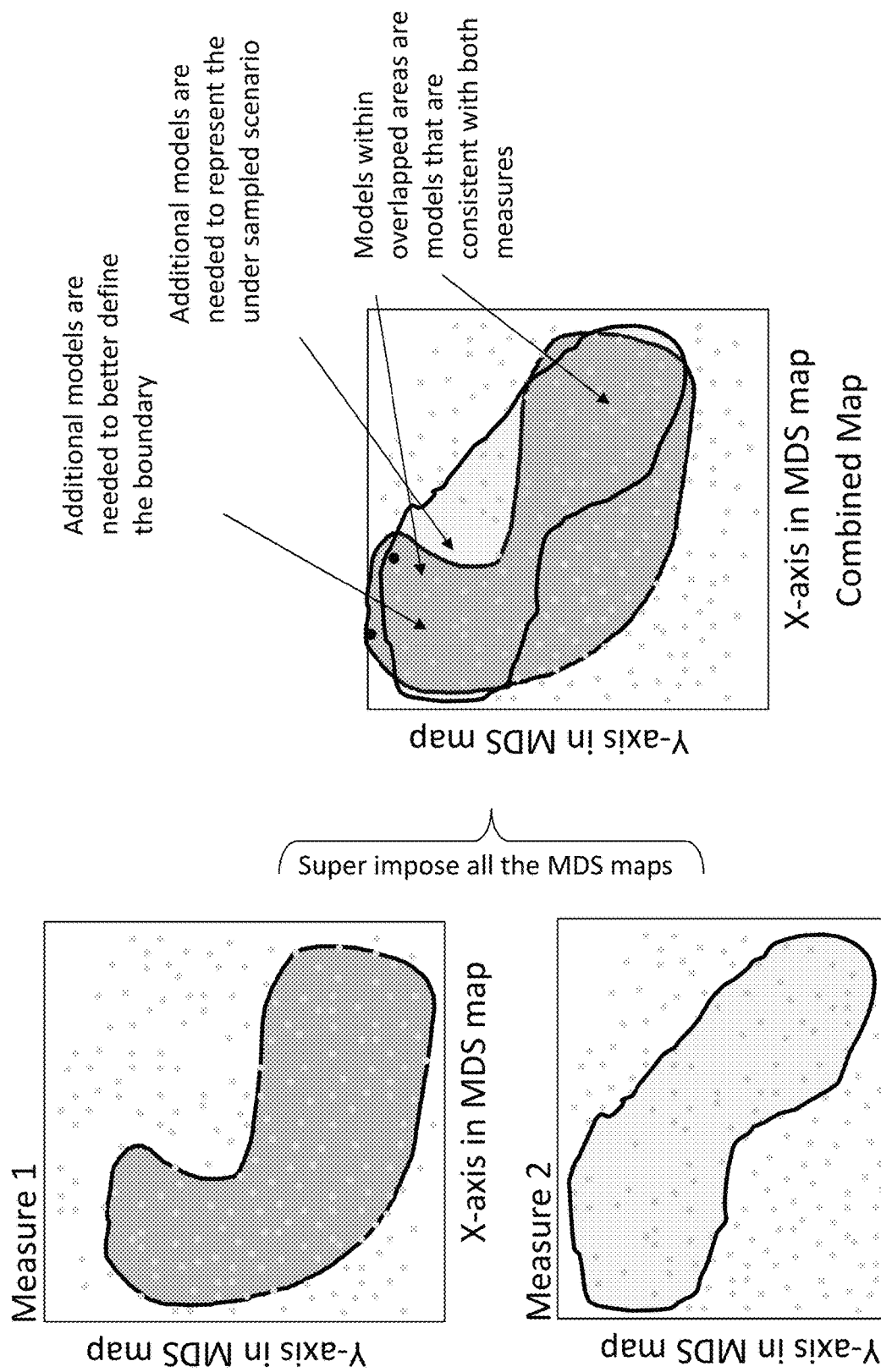
FIG. 8 illustrates a step of a method of physics-based uncertainty analysis, in accordance with some embodiments.

Areas on each of the map where the measure from the model is consistent with that particular data can then be identified as valid area and be differentiated from those area where the measure from the model is not consistent with the particular data, as is demonstrated in FIG. 7. Those maps can then be super imposed on each other and the area where is valid area in all the maps are the area where the simulations are consistent with the data and are physically plausible, as is demonstrated in FIG. 8. The point that represents computational stratigraphy model lies within the area is a digital analog of the subsurface asset and will be part of the collection of the digital analogs forms the ensemble of digital analogs for that specific subsurface asset.

Further, inspections can be made on the spatial distribution of the points within the valid area as discussed in the paragraph above. If the spatial distribution of the points are statistically uneven and non-uniform, then locations on the map where additional points are needed are identified. Using the inverse MDS method, the potential points at those locations on the map are transformed back to the original hyper dimensional parameter space. There, each of the transformed points correspond to a new computational stratigraphy model input parameter. New simulations are run use those new input parameters, and the steps outlined in the above three paragraphs are repeated. This will result in a digital analog ensemble that covers all the physically plausible cases and are fully consistent with all the data from the field.

Figure 9:
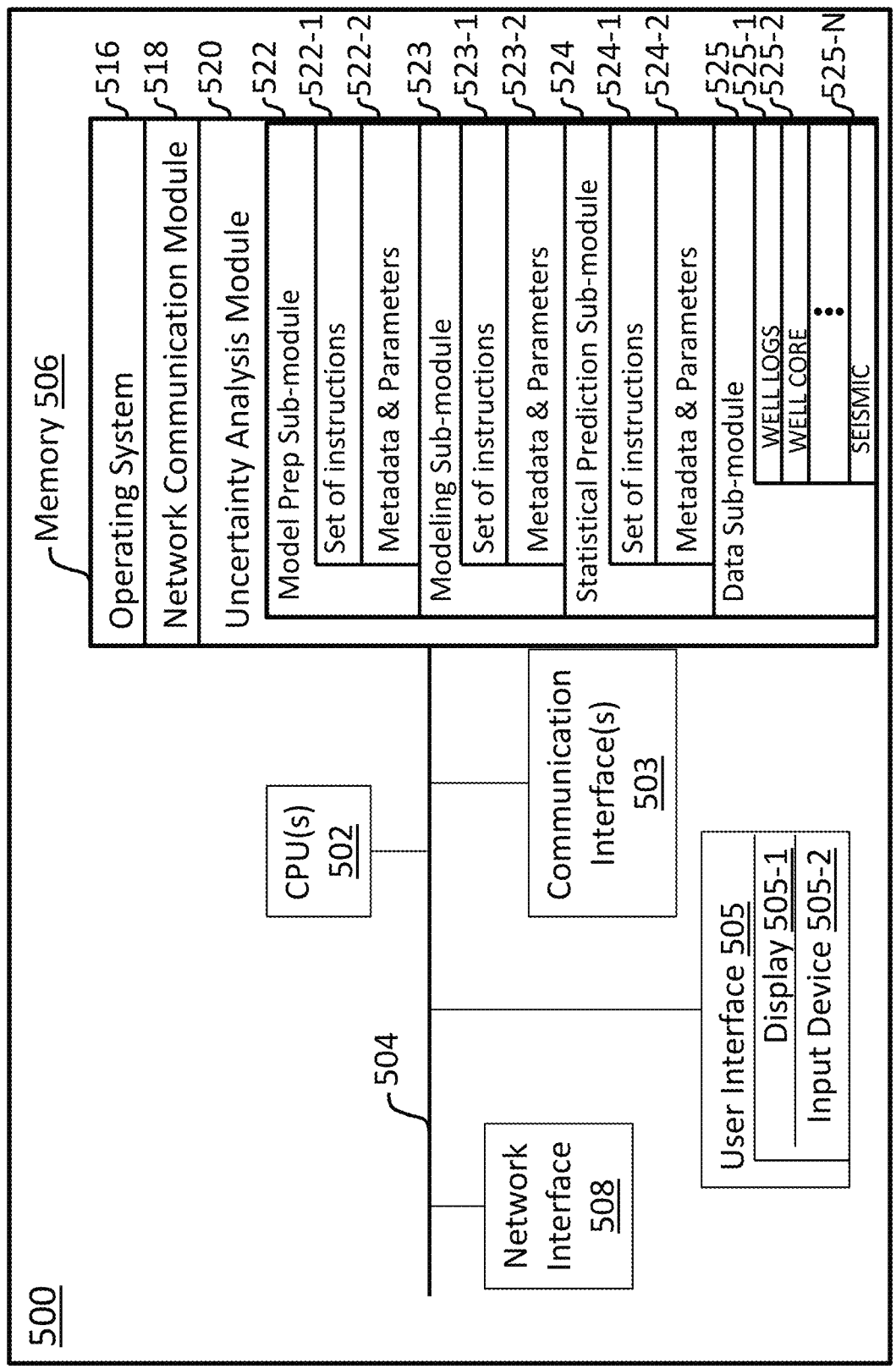
FIG. 9 is a block diagram illustrating a physics-based uncertainty analysis system, in accordance with some embodiments.

FIG. 9 is a block diagram illustrating a subsurface data uncertainty system 500, in accordance with some embodiments. While certain specific features are illustrated, those skilled in the art will appreciate from the present disclosure that various other features have not been illustrated for the sake of brevity and so as not to obscure more pertinent aspects of the embodiments disclosed herein.

To that end, the subsurface data uncertainty system 500 includes one or more processing units (CPUs) 502, one or more network interfaces 508 and/or other communications interfaces 503, memory 506, and one or more communication buses 504 for interconnecting these and various other components. The subsurface data uncertainty system 500 also includes a user interface 505 (e.g., a display 505-1 and an input device 505-2). The communication buses 504 may include circuitry (sometimes called a chipset) that interconnects and controls communications between system components. Memory 506 includes high-speed random access memory, such as DRAM, SRAM, DDR RAM or other random access solid state memory devices; and may include non-volatile memory, such as one or more magnetic disk storage devices, optical disk storage devices, flash memory devices, or other non-volatile solid state storage devices. Memory 506 may optionally include one or more storage devices remotely located from the CPUs 502. Memory 506, including the non-volatile and volatile memory devices within memory 506, comprises a non-transitory computer readable storage medium and may store subsurface data, models, and/or geologic structure information.

In some embodiments, memory 506 or the non-transitory computer readable storage medium of memory 506 stores the following programs, modules and data structures, or a subset thereof including an operating system 516, a network communication module 518, and an uncertainty analysis module 520.

The operating system 516 includes procedures for handling various basic system services and for performing hardware dependent tasks.

The network communication module 518 facilitates communication with other devices via the communication network interfaces 508 (wired or wireless) and one or more communication networks, such as the Internet, other wide area networks, local area networks, metropolitan area networks, and so on.

In some embodiments, the uncertainty analysis module 520 executes the operations of method 100. Uncertainty analysis module 520 may include data sub-module 525, which handles subsurface data including well logs 525-1, well cores 525-2, and other data through seismic 525-N. This data is supplied by data sub-module 525 to other sub-modules.

The model preparation sub-module 522 contains a set of instructions 522-1 and accepts metadata and parameters 522-2 that will enable it to execute operations 10 and 12 of method 100. The modeling sub-module 523 contains a set of instructions 523-1 and accepts metadata and parameters 523-2 that will enable it to contribute to operations 13, 14, and 15 of method 100. The statistical prediction sub-module 524 contains a set of instructions 524-1 and accepts metadata and parameters 524-2 that will enable it to execute at least operation 16 of method 100. Although specific operations have been identified for the sub-modules discussed herein, this is not meant to be limiting. Each sub-module may be configured to execute operations identified as being a part of other sub-modules, and may contain other instructions, metadata, and parameters that allow it to execute other operations of use in processing subsurface data and generating graphic displays of the models and uncertainty analysis. For example, any of the sub-modules may optionally be able to generate a display that would be sent to and shown on the user interface display 505-1. In addition, any of the data or processed data products may be transmitted via the communication interface(s) 503 or the network interface 508 and may be stored in memory 506.

Method 100 is, optionally, governed by instructions that are stored in computer memory or a non-transitory computer readable storage medium (e.g., memory 506 in FIG. 9) and are executed by one or more processors (e.g., processors 502) of one or more computer systems. The computer readable storage medium may include a magnetic or optical disk storage device, solid state storage devices such as flash memory, or other non-volatile memory device or devices. The computer readable instructions stored on the computer readable storage medium may include one or more of: source code, assembly language code, object code, or another instruction format that is interpreted by one or more processors. In various embodiments, some operations in each method may be combined and/or the order of some operations may be changed from the order shown in the figures. For ease of explanation, method 100 is described as being performed by a computer system, although in some embodiments, various operations of method 100 are distributed across separate computer systems.

While particular embodiments are described above, it will be understood it is not intended to limit the invention to these particular embodiments. On the contrary, the invention includes alternatives, modifications and equivalents that are within the spirit and scope of the appended claims. Numerous specific details are set forth in order to provide a thorough understanding of the subject matter presented herein. But it will be apparent to one of ordinary skill in the art that the subject matter may be practiced without these specific details. In other instances, well-known methods, procedures, components, and circuits have not been described in detail so as not to unnecessarily obscure aspects of the embodiments.

The terminology used in the description of the invention herein is for the purpose of describing particular embodiments only and is not intended to be limiting of the invention. As used in the description of the invention and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, operations, elements, and/or components, but do not preclude the presence or addition of one or more other features, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

Although some of the various drawings illustrate a number of logical stages in a particular order, stages that are not order dependent may be reordered and other stages may be combined or broken out. While some reordering or other groupings are specifically mentioned, others will be obvious to those of ordinary skill in the art and so do not present an exhaustive list of alternatives. Moreover, it should be recognized that the stages could be implemented in hardware, firmware, software or any combination thereof.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. A computer-implemented method of subsurface data uncertainty analysis, comprising:
   a. receiving, at a computer processor, subsurface data representative of a subsurface volume of interest;
   b. identifying key controlling parameters for the subsurface volume of interest;
   c. determining maximum possible ranges for each of the key controlling parameters wherein the key controlling parameters are parameters controlling the existence of a subsurface system of interest corresponding to the subsurface volume of interest;
   d. applying experimental design methods to generate initial set of model input parameters corresponding to an initial set of scenarios wherein the initial set of scenarios lie within the maximum possible ranges;
   e. creating models for the subsurface volume of interest corresponding to each of the input parameter combinations as given by the experimental design using physics-based modeling and storing each of the models to an ensemble of potential digital analogs;
   f. comparing, using multiple dimension scaling (MDS) to a 2-D map, each of the models in the ensemble of potential digital analogs with the subsurface data representative of the subsurface volume of interest and adding models that are consistent with the subsurface data to an ensemble of digital analogs for the subsurface volume of interest;
   g. checking whether the ensemble of the digital analogs contains enough models to be statistically significant and, if there are not enough models, repeating steps d-f until the ensemble of the digital analogs contains enough models to be statistically significant by identifying locations on the 2-D map that need models and performing inverse MDS to create a new initial set of scenarios for the experimental design methods;
   h. developing statistical predictions for any specific property for the subsurface volume of interest using the ensemble of the digital analogs; and
   i. displaying, on a graphical interface, the statistical predictions.

2. The method of claim 1 wherein the key controlling parameters include one or more of basin topography, subsidence rate, sea level and sea level changes, source location for sediment supply, grain sizes and types distribution of the sediment supply, and magnitude of the flow into the basin.

3. The method of claim 1 wherein determining maximum possible ranges includes using at least one of sea level curves, channel geometry scaling relationships, hydrographs, and data based on river flow and sediment information.

4. The method of claim 1 further comprising, prior to the applying experimental design methods, a sensitivity of model results with regard to the key controlling parameters are obtained and the key controlling parameters are resealed accordingly, and wherein the applying experimental design methods is in the resealed parameter space to increase the sample efficiency.

5. The method of claim 1 wherein the experimental design methods include Latin Hypercube Sampling.

6. A computer system, comprising:
   one or more processors;
   memory; and
   one or more programs, wherein the one or more programs are stored in the memory and configured to be executed by the one or more processors, the one or more programs including instructions that when executed by the one or more processors cause the system to execute:
   a. receiving, at the one or more processors, subsurface data representative of a subsurface volume of interest;
   b. identifying key controlling parameters for the subsurface volume of interest;
   c. determining maximum possible ranges for each of the key controlling parameters wherein the key controlling parameters are parameters controlling the existence of a subsurface system of interest corresponding to the subsurface volume of interest;
   d. applying experimental design methods to generate initial set of model input parameters corresponding to an initial set of scenarios wherein the initial set of scenarios lie within the maximum possible ranges;
   e. creating models for the subsurface volume of interest corresponding to each of the input parameter combinations as given by the experimental design using physics-based modeling and storing each of the models to an ensemble of potential digital analogs;
   f. comparing, using multiple dimension scaling (MDS) to a 2-D map, each of the models in the ensemble of potential digital analogs with the subsurface data representative of the subsurface volume of interest and adding models that are consistent with the subsurface data to an ensemble of digital analogs for the subsurface volume of interest;
   g. checking whether the ensemble of the digital analogs contains enough models to be statistically significant and, if there are not enough models, repeating steps d-f until the ensemble of the digital analogs contains enough models to be statistically significant by identifying locations on the 2-D map that need models and performing inverse MDS to create a new initial set of scenarios for the experimental design methods;
   h. developing statistical predictions for any specific property for the subsurface volume of interest using the ensemble of the digital analogs; and
   i. displaying, on a graphical interface, the statistical predictions.

7. A non-transitory computer readable storage medium storing one or more programs, the one or more programs comprising instructions, which when executed by an electronic device with one or more processors and memory, cause the electronic device to execute:

a. receiving, at the one or more processors, subsurface data representative of a subsurface volume of interest;

b. identifying key controlling parameters for the subsurface volume of interest;

c. determining maximum possible ranges for each of the key controlling parameters wherein the key controlling parameters are parameters controlling the existence of a subsurface system of interest corresponding to the subsurface volume of interest;

d. applying experimental design methods to generate initial set of model input parameters corresponding to an initial set of scenarios wherein the initial set of scenarios lie within the maximum possible ranges;

e. creating models for the subsurface volume of interest corresponding to each of the input parameter combinations as given by the experimental design using physics-based modeling and storing each of the models to an ensemble of potential digital analogs;

f. comparing, using multiple dimension scaling (MDS) to a 2-D map, each of the models in the ensemble of potential digital analogs with the subsurface data representative of the subsurface volume of interest and adding models that are consistent with the subsurface data to an ensemble of digital analogs for the subsurface volume of interest;

g. checking whether the ensemble of the digital analogs contains enough models to be statistically significant and, if there are not enough models, repeating steps d-f until the ensemble of the digital analogs contains enough models to be statistically significant by identifying locations on the 2-D map that need models and performing inverse MDS to create a new initial set of scenarios for the experimental design methods;

h. developing statistical predictions for any specific property for the subsurface volume of interest using the ensemble of the digital analogs; and i. displaying, on a graphical interface, the statistical predictions.

\* \* \* \* \*